(12) United States Patent
Bell

(10) Patent No.: US 6,778,455 B2
(45) Date of Patent: Aug. 17, 2004

(54) METHOD AND APPARATUS FOR SAVING REFRESH CURRENT

(75) Inventor: Debra M. Bell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 28 days.

(21) Appl. No.: 10/201,306

(22) Filed: Jul. 24, 2002

(65) Prior Publication Data

US 2004/0017719 A1 Jan. 29, 2004

(51) Int. Cl.[7] .................................................. G11C 7/00
(52) U.S. Cl. ..................... 365/222; 365/203; 365/227
(58) Field of Search .............................. 365/222, 203, 365/207, 230.06, 189.11, 189.01

(56) References Cited

U.S. PATENT DOCUMENTS

| | | | |
|---|---|---|---|
| 4,969,125 A | * 11/1990 | Ciraula et al. ............... | 365/203 |
| 5,555,523 A | * 9/1996 | Haga et al. .................. | 365/203 |
| 5,875,143 A | 2/1999 | Ben-Zvi | |
| 5,894,446 A | * 4/1999 | Itou ............................ | 365/222 |
| 5,973,972 A | * 10/1999 | Kwon et al. ................. | 365/203 |
| 6,097,658 A | 8/2000 | Satoh et al. | |
| 6,219,292 B1 | 4/2001 | Jang | |
| 6,252,816 B1 | 6/2001 | Mullarkey | |
| 6,317,852 B1 | 11/2001 | Lau et al. | |
| 6,388,474 B2 | 5/2002 | Sasaki et al. | |

OTHER PUBLICATIONS

Brent Keeth et al., "DRAM Circuit Design: a Tutorial," 2001, pp. 12,13,28,29,50–57,134 and 135.

* cited by examiner

*Primary Examiner*—Gene N. Auduong
(74) *Attorney, Agent, or Firm*—Dickstein Shapiro Morin & Oshinsky LLP

(57) ABSTRACT

The present invention provides a DRAM device, and method for using same. In one aspect, the invention provides a method for operating a complementary input/output line pair driver circuit in a first mode of operation to enable the driver circuit to pre-charge the input/output lines to a first voltage, and operating the driver circuit during an auto refresh mode to prevent the driver circuit from pre-charging the input/output lines to the first voltage.

38 Claims, 13 Drawing Sheets

| SEC_ | $R_D$ | $W_R$ | LINE 46 | LINE 48 |
|---|---|---|---|---|
| 0 | 0 | 0 | 0 | 0 |
| 0 | 1 | 0 | 0 | 1 |
| 0 | 0 | 1 | 0 | 1 |
| 0 | 1 | 1 | 0 | 1 |
| 1 | 0 | 0 | 1 | 1 |
| 1 | 0 | 1 | 0 | 1 |
| 1 | 1 | 0 | 0 | 1 |
| 1 | 1 | 1 | 0 | 1 |

| AUTO_REFRESH | SEC_ | $R_D$ | $W_R$ | LINE 46 | LINE 48 |
|---|---|---|---|---|---|
| 0 | 0 | 0 | 0 | 0 | 0 |
| 0 | 0 | 0 | 1 | 0 | 1 |
| 0 | 0 | 1 | 0 | 0 | 1 |
| 0 | 0 | 1 | 1 | 0 | 1 |
| 0 | 1 | 0 | 0 | 1 | 1 |
| 0 | 1 | 0 | 1 | 0 | 1 |
| 0 | 1 | 1 | 0 | 0 | 1 |
| 0 | 1 | 1 | 1 | 0 | 1 |
| 1 | 0 | 0 | 0 | 1 | 1 |
| 1 | 0 | 0 | 1 | 0 | 1 |
| 1 | 0 | 1 | 0 | 0 | 1 |
| 1 | 0 | 1 | 1 | 0 | 1 |
| 1 | 1 | 0 | 0 | 1 | 1 |
| 1 | 1 | 0 | 1 | 0 | 1 |
| 1 | 1 | 1 | 0 | 0 | 1 |
| 1 | 1 | 1 | 1 | 0 | 1 |

| IOEN | ENW | DWXY | EQIO | SEC_ | IO | IO_ |
|---|---|---|---|---|---|---|
| 0 | X | X | 0 | 0 | $V_{CC}$ | $V_{CC}$ |
| 0 | X | X | 0 | 1 | ILLEGAL | ILLEGAL |
| 0 | X | X | 1 | 0 | FLOAT | FLOAT |
| 0 | X | X | 1 | 1 | $V_{CC}/2$ | $V_{CC}/2$ |
| X | 0 | X | 0 | 0 | $V_{CC}$ | $V_{CC}$ |
| X | 0 | X | 0 | 1 | ILLEGAL | ILLEGAL |
| X | 0 | X | 1 | 0 | FLOAT | FLOAT |
| X | 0 | X | 1 | 1 | $V_{CC}/2$ | $V_{CC}/2$ |
| 1 | 1 | 0 | X | 0 | 0 | 1 |
| 1 | 1 | 0 | X | 1 | ILLEGAL | ILLEGAL |
| 1 | 1 | 1 | X | 0 | 1 | 0 |
| 1 | 1 | 1 | X | 1 | ILLEGAL | ILLEGAL |

X - STATUS DOES NOT MATTER

ILLEGAL - CIRCUIT WILL NOT FUNCTION IN A KNOWN WAY BECAUSE MORE THAN ONE GATE WOULD BE DRIVING THE I/O, I/O_ LINES

FIG. 6A

| A | B | C | Y |
|---|---|---|---|
| 0 | 0 | 0 | 1 |
| 0 | 0 | 1 | 0 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 0 |

| IOEN | ENW | DWXY | AUTO_REFRESH | EQIO | SEC_ | IO | IO_ |
|---|---|---|---|---|---|---|---|
| 0 | X | X | 0 | 0 | 0 | $V_{CC}$ | $V_{CC}$ |
| 0 | X | X | 0 | 0 | 1 | ILLEGAL | ILLEGAL |
| 0 | X | X | 0 | 1 | 0 | FLOAT | FLOAT |
| 0 | X | X | 0 | 1 | 1 | $V_{CC}/2$ | $V_{CC}/2$ |
| X | 0 | X | 0 | 0 | 0 | $V_{CC}$ | $V_{CC}$ |
| X | 0 | X | 0 | 0 | 1 | ILLEGAL | ILLEGAL |
| X | 0 | X | 0 | 1 | 0 | FLOAT | FLOAT |
| X | 0 | X | 0 | 1 | 1 | $V_{CC}/2$ | $V_{CC}/2$ |
| 1 | 1 | 0 | 0 | X | 0 | 0 | 1 |
| 1 | 1 | 0 | 0 | X | 1 | ILLEGAL | ILLEGAL |
| 1 | 1 | 1 | 0 | X | 0 | 1 | 0 |
| 1 | 1 | 1 | 0 | X | 1 | ILLEGAL | ILLEGAL |
| 0 | X | X | 1 | X | 0 | FLOAT | FLOAT |
| 0 | X | X | 1 | X | 1 | $V_{CC}/2$ | $V_{CC}/2$ |
| X | 0 | X | 1 | X | 0 | FLOAT | FLOAT |
| X | 0 | X | 1 | X | 1 | $V_{CC}/2$ | $V_{CC}/2$ |
| 1 | 1 | 0 | 1 | X | 0 | ILLEGAL*0 | ILLEGAL*1 |
| 1 | 1 | 0 | 1 | X | 1 | ILLEGAL | ILLEGAL |
| 1 | 1 | 1 | 1 | X | 0 | ILLEGAL*1 | ILLEGAL*0 |
| 1 | 1 | 1 | 1 | X | 1 | ILLEGAL | ILLEGAL |

X - STATUS DOES NOT MATTER

ILLEGAL - CIRCUIT WILL NOT FUNCTION IN A KNOWN WAY BECAUSE MORE THAN ONE GATE WOULD BE DRIVING THE I/O, I/O_ LINES

ILLEGAL* - CIRCUIT WILL WORK, BUT THE MEMORY DEVICE WILL NOT ALLOW SUCH A STATE

FIG. 9A

METHOD AND APPARATUS FOR SAVING REFRESH CURRENT

FIELD OF THE INVENTION

This invention generally relates to a method and apparatus for refreshing Dynamic Random Access Memory (DRAM) cells. Particularly, the invention relates to a method and apparatus for saving power during an auto-refresh operation.

BACKGROUND OF THE INVENTION

System designers continually push integrated circuit (IC) manufacturers to design ICs, such as volatile-memory ICs, having lower power requirements.

Because the data stored in a volatile memory cell—such as a dynamic-randomaccess-memory (DRAM) cell— degrades relatively quickly, the data must be periodically refreshed. Therefore, an IC that includes one or more volatile memory cells periodically implements refresh cycles in response to system auto-refresh commands.

During a typical refresh cycle, a sense amplifier reads the data stored in the memory cell and then writes the same data back into the cell. More specifically, the cell stores a signal level, such as a voltage level, that represents the value of the stored data. For example, a voltage level of Vcc often represents a data value of logic 1, and a voltage level of ground (0 V) often represents a data value of logic 0. Unfortunately, well-known phenomena such as memory-cell leakage cause this signal level to decay over time. If this signal level is not maintained, it may decay to a point where it represents a data value different than the data value originally stored in the memory cell. For example, a voltage level of Vcc (logic 1) may decay toward 0 V (logic 0), and if not maintained, may eventually become close enough to 0 V to represent logic 0 instead of logic 1. To maintain the stored signal level, the IC containing the DRAM cell implements a refresh cycle during which the sense amplifier receives the signal level from the cell, and restores the signal level of the cell to its full value (i.e., Vcc for logic 1 and 0 V for logic 0).

During normal operation of an IC that contains a volatile memory cell, the memory device incorporating the cell periodically issues an auto-refresh command to refresh the cell in response to a system auto-refresh command. For example, the memory device may include multiple rows of memory cells and a refresh address counter that indicates the row to be refreshed. Each auto-refresh command causes the IC to implement a respective auto-refresh cycle during which the IC refreshes the cells in the addressed row and increments or decrements the counter by one. Subsequent auto-refresh commands repeat this operation, and when all of the rows have been refreshed, the counter "turns over" so that the IC can continue to refresh the rows.

To insure that the system issues auto-refresh commands frequently enough to prevent the memory cells from losing their respective data, the memory device manufacturer specifies the maximum time period that can elapse between successive refreshes of a memory cell. Furthermore, to insure that the refresh cycles are long enough to allow the IC to adequately refresh a memory cell, the memory manufacturer specifies the minimum duration for each refresh cycle. Therefore, once the memory device issues an auto-refresh command to a row of memory cells, a system containing the memory device must wait at least this minimum duration before a memory access command to the row of the memory device can be acted on.

Auto-refresh commands pre-charge the input and output lines, just as required in an activate command in preparation for a read or write operation. As a result, auto-refresh commands consume valuable power and resources from the system. What is needed is a DRAM which reduces the power consumption during an auto-refresh operation.

BRIEF SUMMARY OF THE INVENTION

The present invention provides a DRAM device, and method for using same, capable of reducing power consumption in an auto-refresh mode. In one aspect, the invention provides a method for operating a complementary input/output line pair driver circuit in a first memory access mode of operation to enable the driver circuit to pre-charge the input/output lines to a first voltage, and operating the driver circuit during an auto refresh mode to prevent the driver circuit from pre-charging the input/output lines to the first voltage. As such, pre-charging of the input/outlines is not accomplished during an auto-refresh operation and power consumption is reduced.

In another aspect, a driver for a dynamic memory device is disclosed, comprising a pair of complementary input/ output lines connectable to a memory array, and a control circuit responsive to at least first and second control signals. The first control signal causes the control circuit to apply a first voltage and a second voltage to the input/output lines during memory access operations, and the second control signal, applied during an auto refresh operation, causes the control circuit to prevent application of at least one of the first and second voltages to the input/output lines during an auto-refresh operation.

These and other aspects and advantages of the invention will be apparent from the following detailed description and accompanying drawings.

BRIEF DESCRIPTION OF THE DRAWINGS

FIG. 6A is a truth table for the I/O line driver of FIG. 6;

FIG. 9A is a truth table for the I/O line driver of FIG. 9;

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural and procedural changes may be made without departing from the spirit or scope of the present invention.

Figure 1:
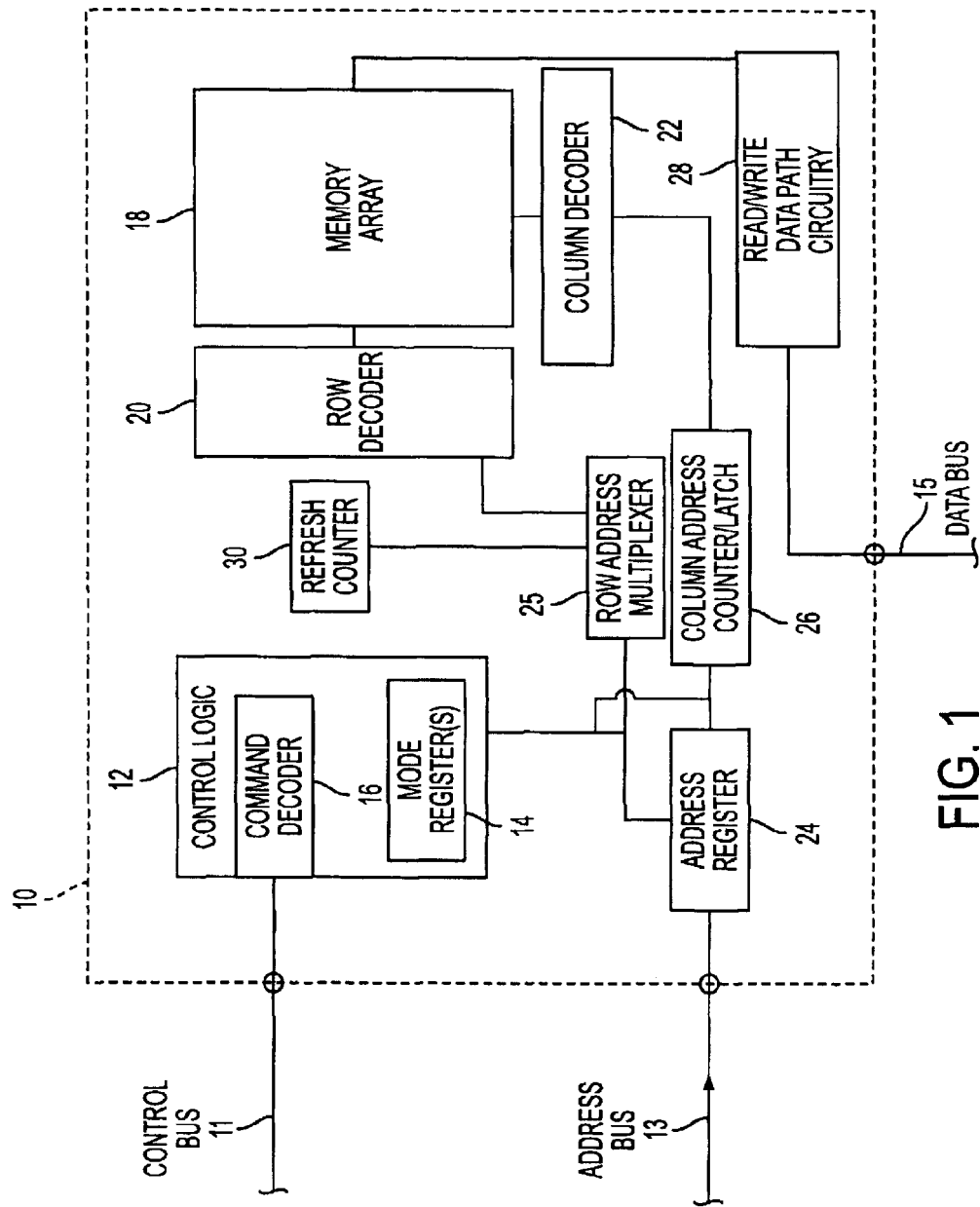
FIG. 1 is a block diagram of a conventional DRAM architecture.

Referring now to the drawings, where like parts are designated by like reference numbers throughout, there is shown in FIG. 1 a simplified block diagram of a conventional DRAM 10. The DRAM 10 has a control logic 12 that contains a mode register 14 and a command decoder 16. The DRAM 10 also has a memory array 18, a row decoder 20 and a column decoder 22, and an address register 24. Multiple memory arrays 18 may be provided in the DRAM 10, along with multiple row decoders 20 and column decoders 22. A row address multiplexer 25, a column address counter/latch 26, and read/write data path circuitry 28 are also provided within the DRAM 10. The DRAM 10 also has a refresh counter 30. The DRAM 10 interfaces with external components through a control bus 11, an address bus 13, and a data bus 15.

In a typical operation of the DRAM 10, row address and column address signals are asserted by a memory controller (not shown) on the address bus 13, and latched into the address register 24. The row address signals are then supplied to the row address multiplexer 25 which transmits the row address signal to the row decoder 20, which appropriately accesses a row of the memory array 18. The column address signals are supplied from the address register 24 to the column address counter/latch 26 which transmits the column address to the column decoder 22, which appropriately accesses a column of the memory array 18. As stated above, if the DRAM contains multiple memory arrays 18, multiple row decoders 20 and column decoders 22 would likewise be provided.

The memory array 18 is coupled to the data bus 15 via read/write data path circuitry 28. The read data path portion of the read/write data path circuitry 28 comprises circuits which store output addressed data and ensure that the proper signal levels are delivered to the data bus 15. The write data path portion of the read/write data path circuitry 28 comprises circuits which accept write data from the data bus 15, hold data to be written, and drive the write data to the addressed areas of memory array 18.

Read and write accesses to the DRAM 10 are typically burst oriented, where the burst length determines the maximum number of column locations that can be accessed for a given read or write command. In order to write data, a memory controller first asserts an activate command with row addresses and then a write command on the control bus 11, while asserting the column address on address bus 13. Subsequently, the memory controller supplies write data to the DRAM 10 via the data bus 15. In order to read data, the memory controller first asserts an activate command with row addresses and then a read command on the control bus 11 while asserting the column address on the address bus 13. During normal operation, the memory controller periodically also issues auto-refresh commands to refresh cells of memory array 18. Each auto-refresh command causes the DRAM 10 to implement an auto-refresh cycle during which the DRAM 10 refreshes the cells in a row identified by a value in the refresh counter 30, and increments or decrements the refresh counter 30. Subsequent auto-refresh commands repeat the cycle. After all of the rows have been refreshed, the refresh counter 30 "turns over" so that the DRAM 10 can continue to refresh the rows. The preceding is a cursory description of the DRAM's 10 operation; the operation may involve numerous additional well known steps involving known components, the descriptions of which are not provided herein for the sake of brevity.

In a typical memory array, such as the one in DRAM 10 of FIG. 1, when a row is auto-refreshed it acts the same way as when an activate operation is occurring in terms of pre-charging the input/output (I/O) lines. Then, as far as the memory is concerned, a refresh command requires a pre-charge of complementary states of the input/output (I/O) lines to a voltage Vcc, just as if the DRAM was undergoing an activate operation.

The pre-charging of the I/O lines is necessary only for an activate command, in anticipation of a read or write operation, but is not necessary during an auto-refresh cycle. This is because in an auto-refresh operation, it is not necessary to pre-charge the I/O lines since a read or write operation is illegal. Thus, existing DRAMs needlessly consume vital power and system resources during auto refresh cycles in pre-charging the input/output lines.

Figure 2:
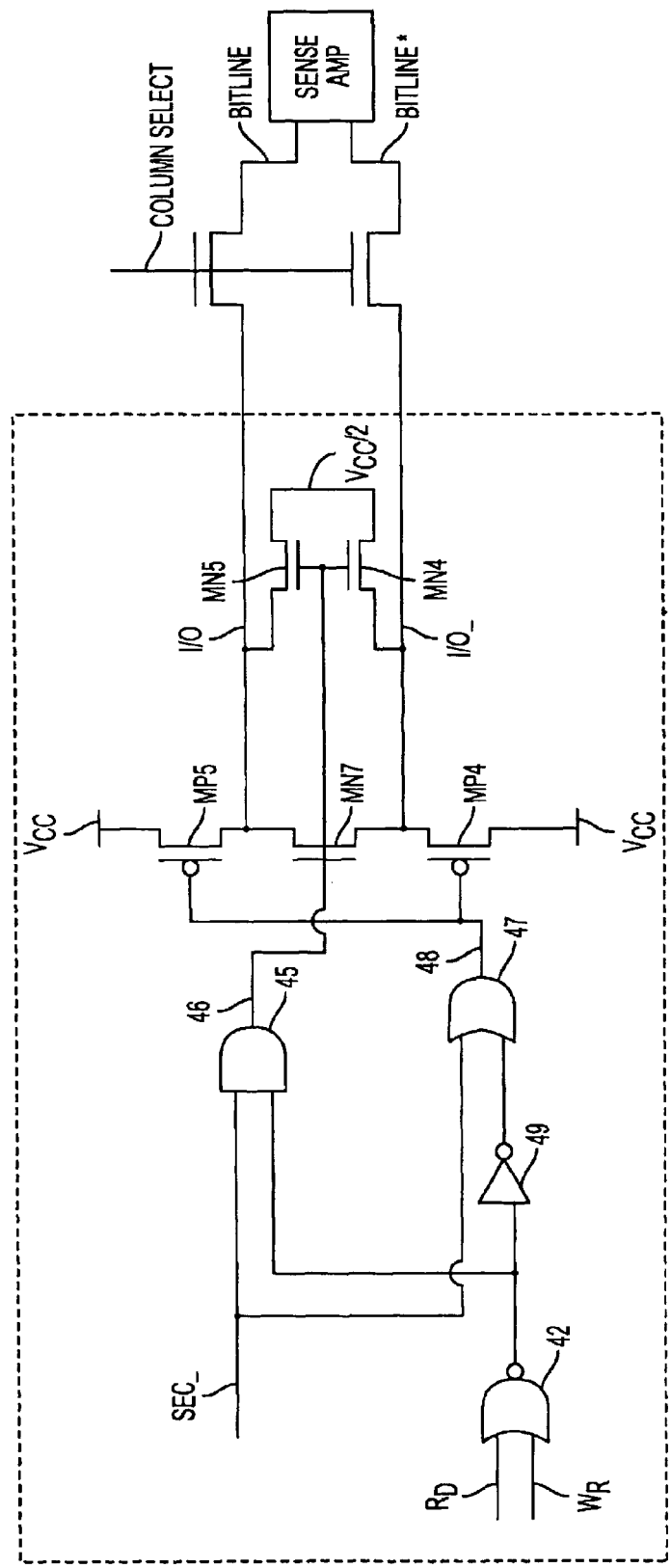
FIG. 2 is a diagram of a conventional input/output (I/O) line driver.

A simplified conventional line driver circuit 40 for equilibrating and pre-charging a pair of complementary I/O lines (I/O, I/O_) in a DRAM is illustrated in FIG. 2. Equilibration of the complimentary I/O, I/O_ lines to a voltage of Vcc/2 is needed for I/O lines that are not to be accessed during a read or write operation to prevent, for example, data corruption. Thus, equilibration is required for normal read/write accesses to the memory cell. Pre-charging of the complementary I/O, I/O_ lines to Vcc is also required for normal read/write accesses to the memory cells as well known, for example, to prevent data corruption.

The line driver circuit 40 comprises p-type MOS transistors MP4 and MP5, and an n-type MOS transistor MN7. The driver circuit 40 further comprises n-type MOS transistors MN4 and MN5. An input section signal SEC_ supplies a voltage signal to the driver circuit 40 through an AND gate 45 and an OR gate 47. The SEC_ signal is usually applied to a specific section of complementary I/O lines, which could typically consist of 8 or 16 complementary I/O lines, and is typically the same signal for both activate and auto refresh cycles. The line driver circuit 40 further comprises an NOR gate 42 which has respective inputs Rd and Wr for signals indicating read and write operation. The NOR gate 42 is connected to the AND gate 45, and to the OR gate 47 through an inverter 49.

Figures 2A, 3:
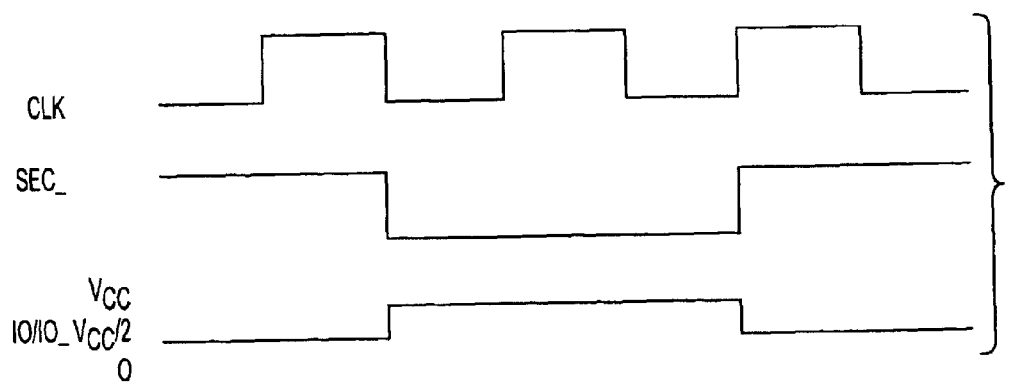
FIG. 2A is a truth table for the I/O fine driver of FIG. 2.
FIG. 3 is a timing diagram useful in explaining the operation of the I/O line driver of FIG. 2.

FIG. 2A shows the truth table for a portion of the driver circuit 40 while FIG. 3 shows a timing diagram. When the signal on SEC_ is high (the SEC_ signal is high when no rows are active in that particular section), and both Rd and Wr signals are low, the signal is high on line 46 and high on line 48. This turns transistors MP4 and MP5 off, and transistors MN4, MN5 and MN7 on. As such, voltage source Vcc/2 is supplied through transistors MN4, MN5 to equalize complementary lines I/O and I/O_ (referred to herein as output lines for the sake of brevity).

The lines I/O and I/O_ are therefore equilibrated to the voltage Vcc/2. As shown in FIG. 2, the output lines I/O and I/O_ may be, for example, lines connected to column selects in a DRAM. The column selects connect the output lines to bit lines, which in turn are connected to a sense amplifier. This is an exemplary arrangement, and many variations of such arrangements are well known in the art and will benefit from the invention.

When the signal supplied on SEC_ is low, such as during an auto-refresh command or when a row in that section is active, any combination of signals on inputs Rd and Wr will cause a low signal on line 46. This causes transistors MN4, MN5 and MN7 to turn off, thereby disconnecting the I/O and I/O_ lines from Vcc/2. If the signal on either, or both, line Rd and Wr is high, the signal on line 48 will be high. Then, transistors MP4 and MP5 will be off, and lines I/O and I/O_ will float, or be undriven by a voltage source. If both lines Rd and Wr are low, then the signal on line 48 would be low, and transistors MP4 and MP5 would connect voltage source Vcc to the output lines I/O and I/O_. This step, the closing of transistors MP4 and MP5, precharges the output lines I/O and I/O_ to Vcc.

The timing diagram of FIG. 3 represents only the portion of the operation applicable when the I/O lines are equilibrated or pre-charged. CLIK represents a system clock. As illustrated, when signal SEC_ is high, outputs I/O and I/O_ are equilibrated to Vcc/2 if both signals Rd and Wr are low. When the signals SEC_ Rd and Wr are low, outputs I/O and I/O_ are pre-charged to Vcc. Although FIG. 2 shows the SEC_ signal turning transistor MN7 on at the same time as transistors MN4 and MN5, it is also possible to use a separate equilibrate signal to turn transistor MN7 on at the same time or before or after the SEC_ signal turns transistors MN4 and MN5 on.

The pre-charging I/O and I/O_ to Vcc occurs, for example, when a row is accessed in a memory array of a DRAM device on activate or auto-refresh commands. The I/O lines, which connect to column selects and then to sense amps, toggle between Vcc/2 and Vcc. When the auto-refresh command is complete, or a pre-charge occurs, the input/output lines equilibrate back to Vcc/2. Pre-charging the complementary I/O lines to Vcc is done primarily to prepare the I/O lines for a memory access such as a read or write command. Following pre-charging the I/O lines, as conventional during read or write operations and as well known in the art, one of the complementary I/O lines is set to a higher voltage potential relative to the other I/O line's potential.

The switching current required to pre-charge and then equilibrate the I/O lines when no read or write operation occurs consumes power in the line driver circuit of FIG. 2. The present invention reduces power consumption during refresh cycles by keeping the I/O lines equilibrated to Vcc/2, or by allowing the I/O lines to float undriven by a voltage source, without pre-charging the I/O lines to Vcc.

Figure 4:
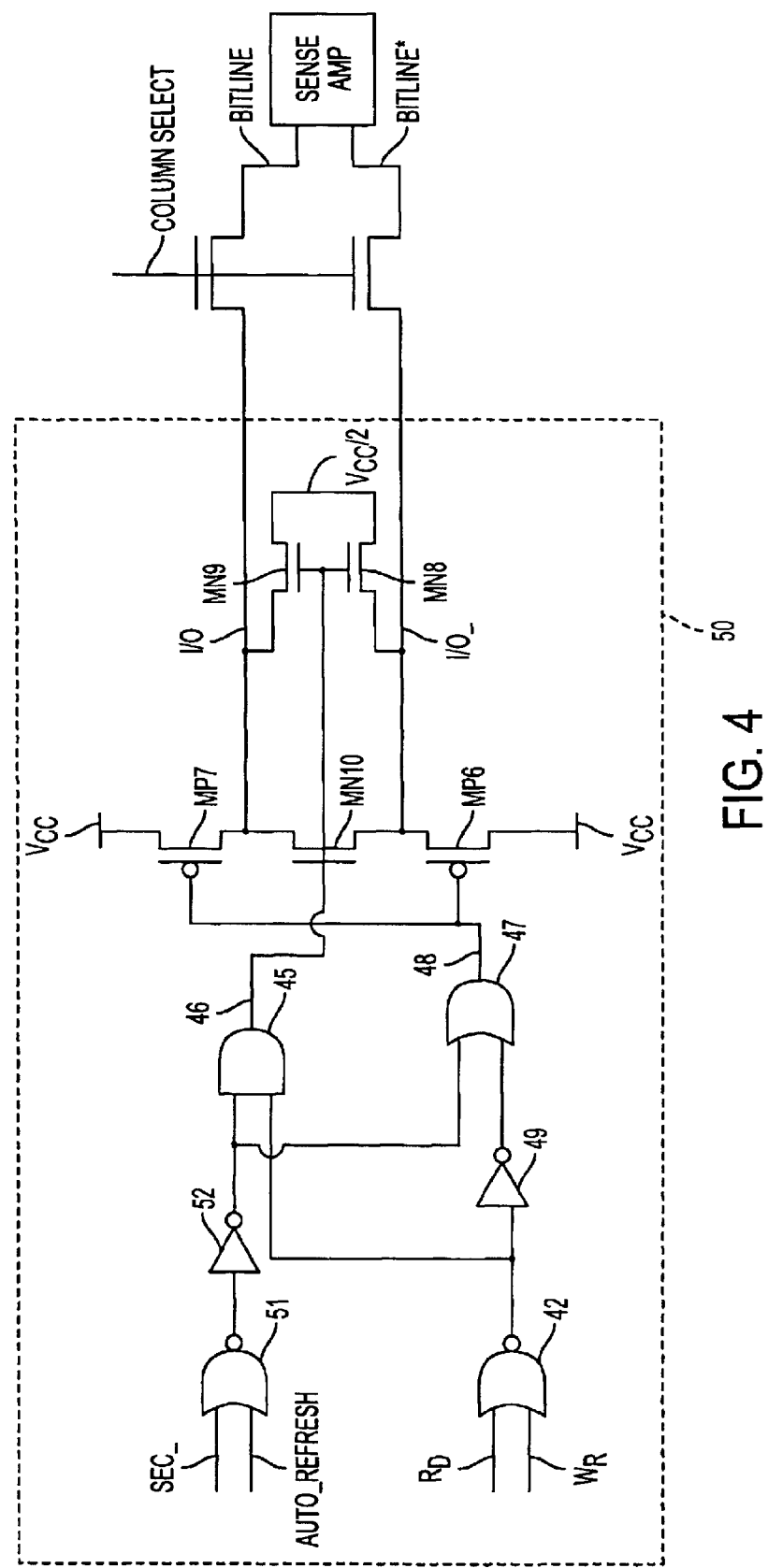
FIG. 4 is a is a diagram an I/O line driver in accordance with a first embodiment of the invention.
Figures 4A, 5:
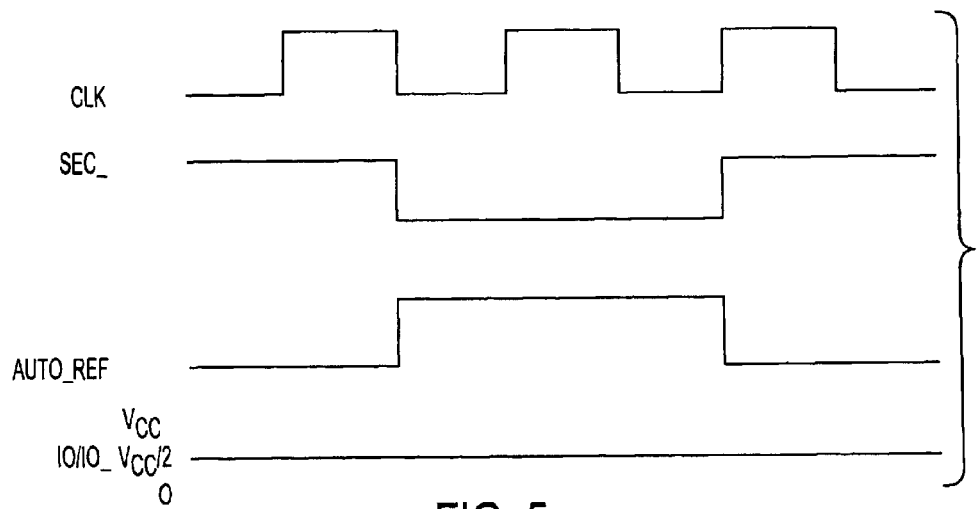
FIG. 4A is a truth table for the I/O line driver of FIG. 4.
FIG. 5 is a timing diagram useful in explaining operation of the I/O line driver of FIG. 4.

A first embodiment of the invention is illustrated with respect to the simplified FIG. 2 circuit and is shown in FIG. 4. The truth table for the FIG. 4 circuit is shown in FIG. 4A, while a timing diagram is shown in FIG. 5. An I/O line driver in accordance with the invention is generally designated by numeral 50. The line driver 50 comprises a NOR gate 51 and an inverter 52. The gate 51 has two input signals, section signal SEC_ and an AUTO_REFRESH signal, which is generated when an auto refresh operation occurs. The gate 51 functions' such that only if both the SEC_ and AUTO_REFRESH input signals are low, the output of the 51 gate will be high. Otherwise, the output of the 51 gate will be low. The output signal from NOR gate 51 is inverted by the inverter 52.

The output signal from the inverter 52 is sent to the remainder of the driver circuit 50, which is otherwise as illustrated in FIG. 2, and comprises an AND gate 45, p-type MOS transistors MP6 and MP7, and n-type MOS transistors MN8, MN9 and MN10. The line driver 50 also comprises a NOR gate 42, inverter 49 and an OR gate 47.

FIG. 5 represents only a portion of the operation of the driver 50 which occurs during auto-refresh. During an auto-refresh mode, when the SEC_ signal goes low to pre-charge the I/O and I/O_ lines, the AUTO_REFRESH signal is asserted high. Thus, the output from the NOR gate 51 will always be low during the auto refresh mode. The low output signal from gate 51 will be inverted into a high signal by the inverter 52, and applied to inputs of the AND gate 45 and the OR gate 47. One high input to the OR gate 47 leads to, regardless of the state of its other input, a high signal output on line 48. Thus, the SEC_ signal is prevented from turning on transistor MP7 or MP6 and pre-charging the I/O and I/O_ lines to Vcc during this period.

The output of the AND gate 45 onto line 46 will be high only if both Rd and Wr signals are low, and either or both signals SEC_ and AUTO_REFRESH are asserted high. In this case, while p-type MOS transistors MP6 and MP7 remain off, the n-type MOS transistors MN8, MN9 and MN10 turn on. The I/O and I/O_ output lines will remain at Vcc/2, rather than pre-charging to Vcc. For any other combination of signals while AUTO_REFRESH signal is asserted high, the signal on line 46 will be low, turning off transistors MN8, MN9 and MN10. In this case, lines I/O and I/O_ will simply float, and are not connected to a voltage source.

The SEC_ signal is asserted in the same way during auto a refresh command as during an activate command. Therefore during an auto refresh cycle, while the word lines of the DRAM are asserted and subsequently cause the cells of the memory array to be refreshed, the I/O lines connected to column selects are not pre-charged to Vcc. This saves power during auto-refresh cycles. Similar to FIG. 2, when a read or write operation is executed after the I/O lines are pre-charged to Vcc, the I/O lines are charged to the read or write data. As a result, after pre-charging the I/O lines, a read or write signal is applied to gate 42 permitting the I/O and I/O_ lines to move, one to a high voltage and one to a low voltage, depending on the read or write data.

Figure 6:
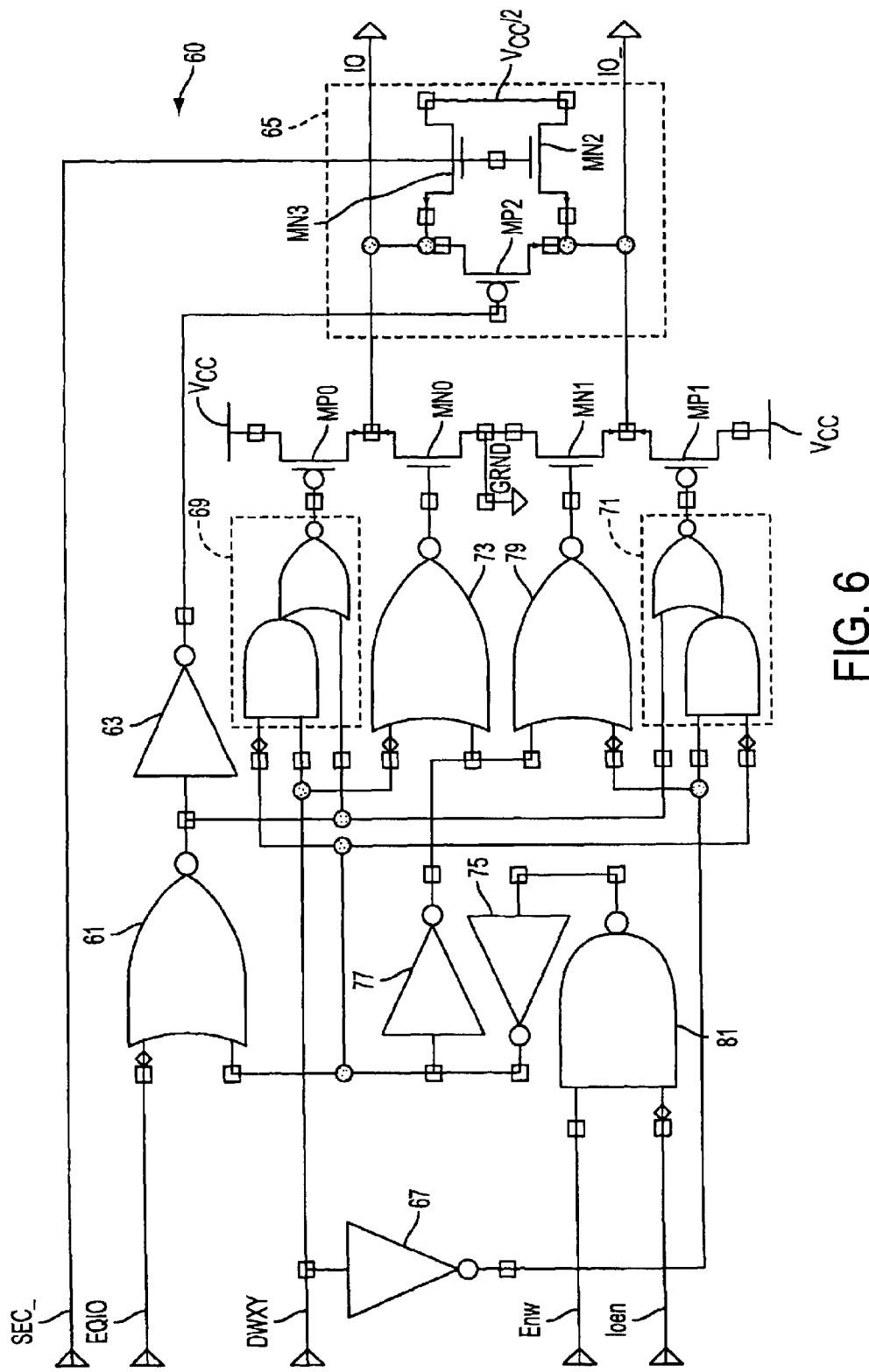
FIG. 6 is a schematic diagram of another conventional I/O line driver.
Figures 7A, 7B:
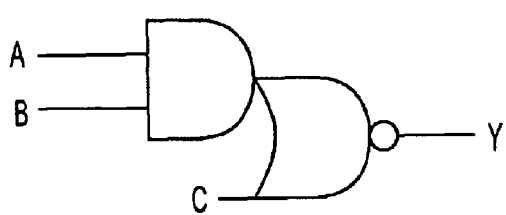
FIGS. 7A and 7B are a schematic diagram and a truth table of AND/NOR gates illustrated in FIG. 6.

While FIG. 2 illustrates a simplified conventional refresh circuit, a slightly more complex conventional refresh circuit is illustrated in FIG. 6 by numeral 60. The I/O drive circuit 60 comprises a NOR gate 61, the output of which goes to an inverter 63. The output of the inverter 63 is connected to a p-type MOS transistor MP2, which is part of an equilibration circuit 65. The I/O driver 60 has a section input signal SEC_ connected to n-type MOS transistors MN2 and MN3, which are also part of the equilibration circuit 65. A write data input signal DWXY is connected to an inverter 67, AND/NOR gate 69 and NOR gate 73, and, through inverter 67, DWXY connects to AND/NOR gate 71 and NOR gate 79. A schematic diagram and a truth table for AND/NOR gates 69 and 71 are provided in FIGS. 7A–B. During a data write operation AND/NOR gates 69 and 71, and NOR gates 73, 79, are used to write data present on the DWXY input and its complement, formed by inverter 67, on the complementary I/O, I/O_ lines.

The I/O driver 60 further comprises two p-type MOS transistors MP0 and MP1 connected between voltage sources Vcc and respective lines I/O and I/O_. Signal lines Enw (enable write) and Ioen (input/output enable), which for example are associated with write commands, are connected to a NAND gate 81. Individual functionality of the noted gates and other components of the driver circuit 60 is generally known in the art and not discussed in great detail herein. The I/O driver circuit 60 depicted in FIG. 6 is only illustrative of the many types of I/O driver circuits which may incorporate and benefit from the present invention, and is not in any way meant to be limiting.

A truth table for the I/O driver 60 is shown in FIG. 6A. In a typical write operation, signals Enw and Ioen are asserted high causing a low input from gate 81 to go to inverter 75. Inverter 75 in turns provides a high signal to inverter 77 and to an input of gate 61, causing gate 61 to provide a low output which is inverted high by inverter 63, causing transistor MP2 to be off. The inverter 77 supplies a low input to gates 73 and 79. The other inputs of gates 73 and 79 are supplied from signal DWXY, which supplies either high or low data to the I/O lines. The following description assumes a high signal on input line DWXY.

A high signal on DWXY causes a high signal to gate 73 and a low signal (inverted by inverter 67) to gate 79. These input signals on gates 73 and 79 cause the gates to output, respectively, low and high signals. Thus, transistor MN1 is turned on, connecting line I/O_ to ground, and transistor MN0 is turned off, disconnecting line I/O from ground.

The high output from inverter 75 is also transmitted to a first input of the AND/NOR gates 69 and 71. The second input of gates 69 and 71 is supplied by the data signal DWXY, which (in this example) supplies a high signal to gate 69 and a low signal (inverted by inverter 67) to gate 71. The first and second inputs of combined AND/NOR gates 69 and 71 supply the AND portion of the AND/NOR gates 69 and 71. The third input of gates 69 and 71 is supplied as a low signal from gate 61. The output of gates 69 and 71 are then, respectively, low and high. This causes transistor MP0 to turn on, thereby connecting line I/O to Vcc, and transistor MP1 to turn off, thereby disconnecting line I/O_ from Vcc. Thus, during a write command, when input data signal DWXY is high, line I/O is driven to Vcc while line I/O_ is connected to ground. A low data signal on DWXY, in turn, would operate gates 69, 73, 79 and 71 to cause line I/O_ to be driven to Vcc and line I/O to connect to ground.

Figure 8:
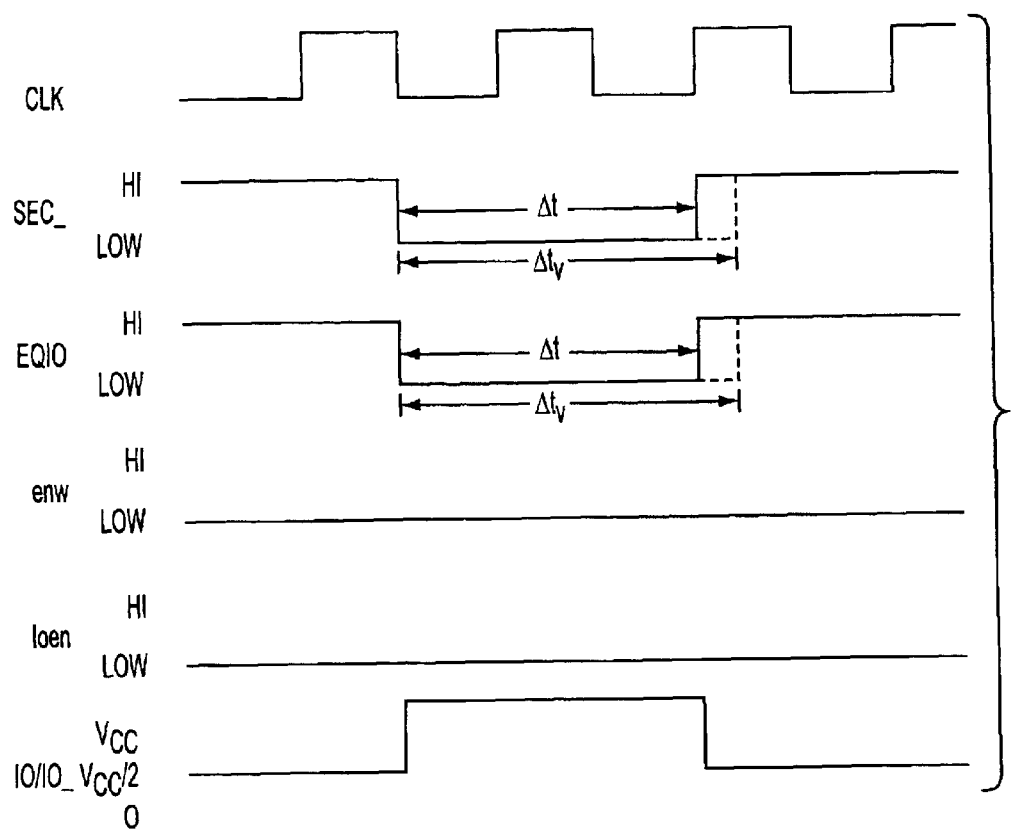
FIG. 8 is a timing diagram useful in explaining the operation of the I/O line driver of FIG. 6.

With reference to the timing diagram shown in FIG. 8 and the truth table of FIG. 6A, an exemplary operation of the I/O driver circuit 60 during an auto refresh and activate cycle is described below. In FIG. 8, the length Δt for signals SEC_ and EQIO, represents the duration of the signals during an auto refresh operation, whereas length Δt$_v$ represents the duration of the signals during an activate command. Both Enw and Ioen signals are low. As noted, the Enw and Ioen signals are asserted high during write commands, which do not occur during an auto refresh cycle. A low input to NAND gate 81 results in a high input signal to inverter 75, and subsequently a low input signal to NOR gate 61. The equilibrate EQIO signal is asserted low to the NOR gate 61, and gate 61 outputs a high signal to the inverter 63. In turn, the inverter 63 supplies a low signal to p-type MOS transistor MP2, turning on the transistor MP2 to equilibrate the I/O, I/O_ lines. At the same time, section signal SEC_, previously asserted high to turn on transistors MN2 and MN3 and apply Vcc/2 to lines I/O and I/O_, is asserted low to transistors MN2 and MN3, tuning them off.

The high signal from gate 61 is also applied to inputs of AND/NOR gates 69 and 71. This causes the gates 69 and 71 to output a low signal, thereby turning on p-type transistors MP0 and MP1. At the same time, the low output from inverter 75 is inverted high by inverter 77, and the high signal is supplied to inputs of NOR gates 73 and 79. The gates 73 and 79 output a low signal, and turn off n-type transistors MN0 and MN1, which are respectively provided between the I/O, I/O_ lines and ground. In this configuration, with p-type transistors MP0, MP1 and MP2 on and with n-type transistors MN0, MN1 MN2 and MN3 off, the output lines I/O and I/O_ are pre-charged to Vcc. Transistor MP2, when on, equilibrates the I/O, I/O_ lines. Thus, the I/O and I/O_ output lines are pre-charged to Vcc not only on a read or write activate command, but also on an auto refresh command. As discussed above, pre-charging the I/O lines on an auto-refresh command unnecessarily consumes system power and resources.

Figure 9:
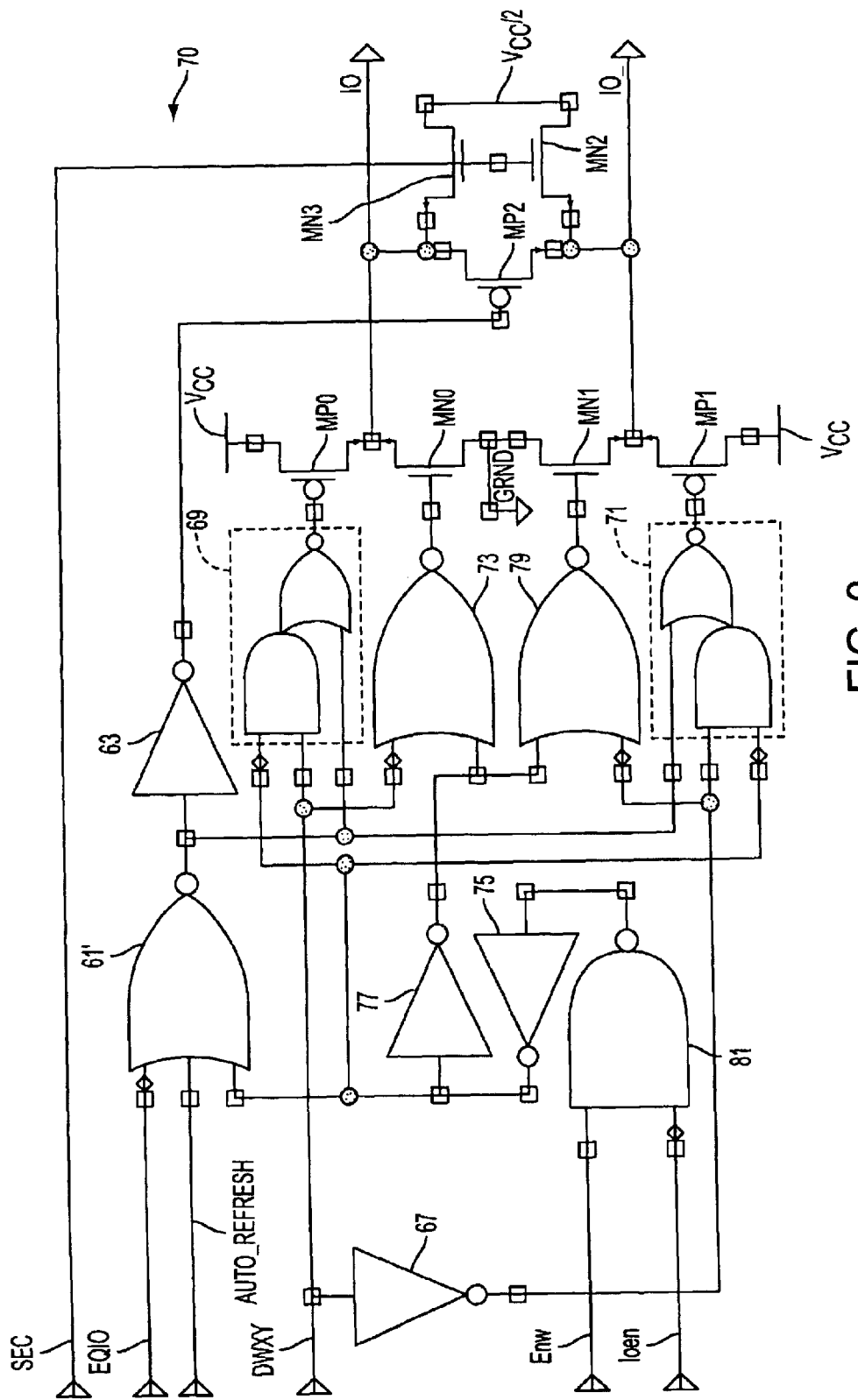
FIG. 9 is a diagram of an I/O line driver in accordance with a second embodiment of the invention.

FIG. 9 illustrates a modification of the FIG. 6 circuit in accordance with a second embodiment of the invention. As shown, I/O driver 70 is similar to I/O driver 60, but in addition has an Auto_Refresh signal line connected to the NOR gate 61' which has an additional input. A truth table for the I/O driver 70 is shown in FIG. 9A.

Figure 10:
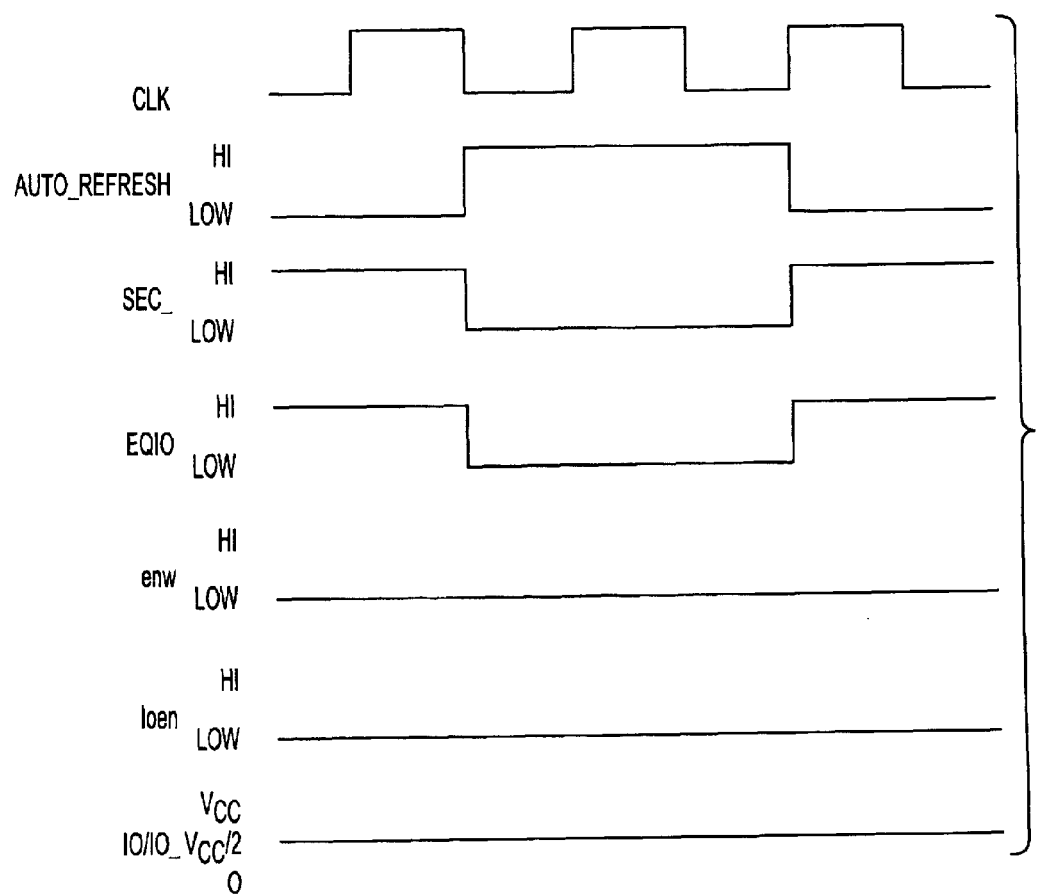
FIG. 10 is a timing diagram useful in explaining the operation of the I/O line driver of FIG. 9.

FIG. 10 shows the timing diagram of the FIG. 9 circuit during an auto refresh operation. The Auto_Refresh signal is asserted high during an auto refresh operation. As such, the output signal from NOR gate 61' will be low and the output signal from inverter 63 to transistor MP2 will be high. Thus, p-type transistor MP2 will be off, and lines I/O and I/O_ will not be equilibrated. At the same time, the low output from NOR gate 61' is supplied to the AND/NOR gates 69 and 71. As a result, the output signal from gates 69 and 71 will be high, causing the p-type transistors MP0 and MP1 to turn off. Transistors MP0 and MP1 thereby isolate the output lines I/O and I/O_ from voltage sources Vcc, associated with transistors MP0 and MP1. As a result, the I/O lines are not pre-charged during an auto refresh operation of the DRAM. In addition, transistors MN0 and MN1 are off by the gating of the NOR gates 73 and 79. In this case, the I/O and I/O_ lines simply float in an un-driven state. The Auto_Refresh signal therefore prevents pre-charging of the I/O selects while other portions of the DRAM, namely the memory array cells, undergo the auto-refresh cycle. A direct benefit of this is that power is saved during the auto refresh operation.

Figure 11:
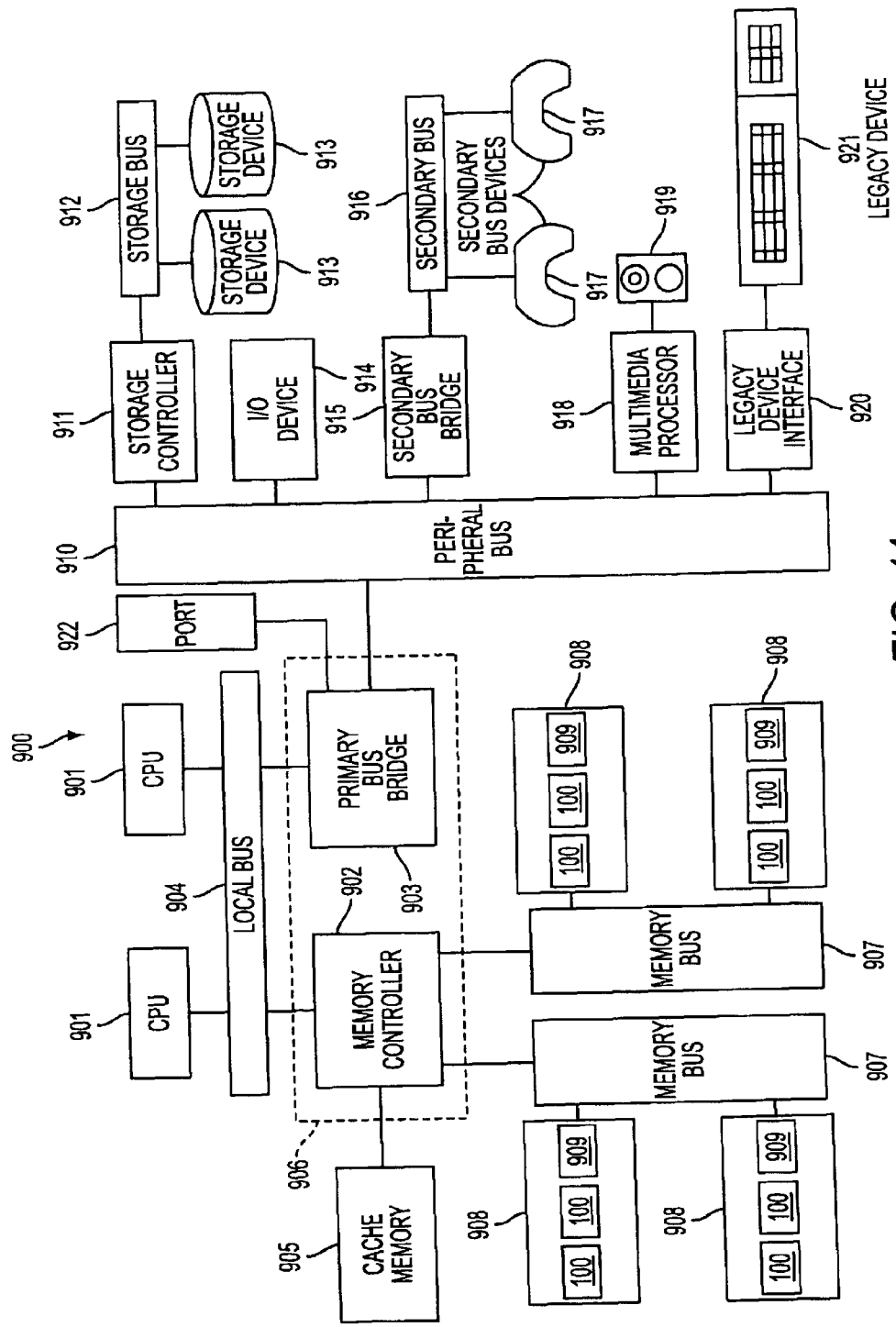
FIG. 11 is a diagram of a computer system having the memory device employing the present invention.

FIG. 11 illustrates an exemplary processing system 900 which may utilize a DRAM device containing the present invention. The DRAM in accordance with the present invention is designated by numeral 100. The processing system 900 includes one or more processors 901 coupled to a local bus 904. A memory controller 902 and a primary bus bridge 903 are also coupled to the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908 which include at least one memory device 100 of the present invention. The memory components 908 may be a memory card or a memory module. Examples of memory modules include single inline memory modules (SIMMs) and dual inline memory modules (DIMMs). The memory components 908 may include one or more additional devices 909. For example, in a SIMM or DIMM, the additional device 909 might be a configuration memory, such as a serial presence detect (SPD) memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 includes peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 may also be coupled to a peripheral bus 910. Various devices, such as peripherals or additional bus bridges may be coupled to the peripheral bus 910. These devices may include a storage controller 911, a miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be a local area network interface, such as an Ethernet card. The secondary bus bridge may be used to interface additional devices via another bus to the processing system. For example, the secondary bus bridge may be an universal serial port (USB) controller used to couple USB devices 917 via secondary bus 916 to the processing system 900. The multimedia processor 918 may be a sound card, a video capture card, or any other type of media interface, which may also be coupled to additional devices such as speakers 919. The legacy device interface 920 is used to couple legacy devices 921, for example, older styled keyboards and mice, to the processing system 900.

The processing system 900 illustrated in FIG. 11 is only an exemplary processing system with which the invention may be used. While FIG. 11 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory devices 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While exemplary embodiments of the invention have been described and illustrated, it should be apparent that many modifications can be made to the present invention without departing from its spirit and scope. Accordingly the invention is not limited by the foregoing description or drawings, but is only limited by the scope of the appended claims.

What is claimed as new and desired to be protected by Letters Patent of the United States is:

1. A method for refreshing data stored in a memory device, the method comprising:
   operating a complementary input/output line pair driver circuit in a first mode of operation to enable said driver circuit to pre-charge said input/output lines to a first voltage; and
   operating said driver circuit during an auto refresh mode to prevent said driver circuit from pre-charging said input/output lines to said first voltage.

2. The method according to claim 1 wherein said pre-charging changes said input/output lines to Vcc.

3. The method according to claim 1 further comprising operating said driver circuit to equilibrate said input/output lines to a predetermined equilibrate voltage during a refresh operation.

4. The method according to claim 3 wherein said equilibrate voltage is Vcc/2.

5. The method according to claim 1 wherein when said driver circuit prevents the pre-charging of said input/output lines, said input/output lines float by remaining un-driven by a voltage source.

6. The method according to claim 1 wherein when said driver circuit prevents pre-charging of said input/output lines, said input/output lines are connected to voltage Vcc/2.

7. The method according to claim 1 further comprising sending a signal to said driver circuit during said auto refresh mode to prevent said driver circuit from pre-charging said input/output lines.

8. A method for operating a dynamic memory device, said method comprising:
   fabricating a driver circuit for a dynamic memory device, said driver circuit driving complementary input/output signal lines between a first voltage and a second voltage;
   sending, during an access mode of operation, a first signal to said driver circuit, said first signal causing said driver circuit to move said input/output lines between said first voltage and said second voltage during said memory access operation; and
   sending, during an auto refresh mode of operation, a second signal to said driver circuit to prevent said driver circuit from applying one of said first voltage and said second voltage to said input/output signal lines.

9. The method according to claim 8 wherein said first voltage is different from said second voltage.

10. The method according to claim 8 further comprising equilibrating said input/output signal lines with one of said first and second voltages.

11. The method according to claim 10 further comprising pre-charging said input/output signal lines with the other of said first and second voltages.

12. The method according to claim 8 wherein said second signal causes said driver circuit to float said input/output lines by disconnecting said lines from a voltage source.

13. The method according to claim 8 wherein said second signal causes said driver circuit to connect said input/output lines to voltage Vcc/2.

14. The method according to claim 8 wherein one of said first or second voltages is an equilibrate voltage of Vcc/2 and the other of said first of second voltages is Vcc.

15. A method for reducing power consumption during an auto refresh cycle of a memory array, said method comprising:
   operating a driver circuit to apply a pre-charge voltage to input/output lines of said driver circuit when an activate command is received; and
   operating said driver circuit to prevent application of said pre-charge voltage to said input/output lines when a refresh command is received.

16. The method according to claim 15 wherein said pre-charge voltage is Vcc.

17. The method according to claim 15 wherein said act of preventing application of said pre-charge voltage allows said input/output lines to float.

18. The method according to claim 15 wherein said act of preventing application of said pre-charge voltage connects said input/output lines to voltage Vcc/2.

19. A pre-charge circuit for input/output lines of memory device, said pre-charge circuit comprising:

a pair of complementary input/output lines; and a driver circuit comprising a pre-charge circuit for applying a pre-charge voltage to said input/output lines during operation of said memory device when an activate command is received, and for preventing the application of said pre-charge voltage to said input/output lines during operation of said memory device when a refresh command is received.

20. The pre-charge circuit according to claim 19 wherein said driver circuit further comprises an equilibration circuit for equilibrating said input/output lines to an equilibrate voltage different from said pre-charge voltage.

21. The pre-charge circuit according to claim 20 wherein said equilibrate voltage and said pre-charge voltage are Vcc/2 and Vcc respectively.

22. The pre-charge circuit according to claim 19 wherein said driver circuit is responsive to an auto-refresh signal indicating when an auto-refresh operation is occurring.

23. The pre-charge circuit according to claim 19 wherein said memory device is a DRAM.

24. A driver circuit for a dynamic memory device, said driver comprising:

a pair of complementary input/output lines connectable to a memory array;

a control circuit responsive to at least a first and second control signals, said first control signal causing said control circuit to apply a first voltage and a second voltage to said input/output lines during operations of said memory device, said second signal causing said control circuit to prevent application of at least one of said first and second voltages to said input/output lines.

25. The driver circuit according to claim 24 further comprising an equilibration circuit for equilibrating said input/output lines.

26. The driver circuit according to claim 24 wherein said first voltage is Vcc/2 and said second voltage is Vcc.

27. The driver circuit according to claim 24 wherein said first control signal is a select signal.

28. The driver circuit according to claim 24 wherein said second input signal corresponds to an auto refresh signal.

29. The driver circuit according to claim 28 wherein said driver circuit is responsive to said auto refresh signal indicating when an auto-refresh operation is occurring.

30. The driver circuit according to claim 24 wherein said driver circuit is part of a DRAM device.

31. The driver circuit according to claim 24 wherein said second signal prevents pre-charging of said input/output lines.

32. A driver for input/output lines of a memory device, said driver comprising:

a control circuit capable of pre-charging said input/output lines to a first voltage to enable said memory device to perform a read or write operation using said input/output lines, said control circuit being responsive to an auto-refresh signal wherein said signal prevents said control circuit from pre-charging said input/output lines.

33. An input/output line driver for operating a memory device, comprising:

a circuit operable to equilibrate and to pre-charge input/output lines of said memory device, and to access memory areas of said memory device, said circuit being operable in an auto-refresh mode to equilibrate said input/output lines and to access said memory areas, but not to pre-charge said input/output lines.

34. The driver according to claim 33 wherein said circuit is operable in said auto-refresh mode to float said input/output lines.

35. A method for operating a memory device, comprising:

operating said memory device, during a memory access mode, to equilibrate input/output lines of said memory device, pre-charge said input/output lines, and access memory areas of said memory device; and operating said memory device, during an auto-refresh mode, to equilibrate said input/output lines and to access said memory areas, but not to pre-charge said input/output lines.

36. A method for operating a memory device, comprising:

operating said memory device, during a memory access mode, to equilibrate input/output lines of said memory device, pre-charge said input/output lines, and access memory areas of said memory device; and operating said memory device, during an auto-refresh mode, to equilibrate said input/output lines and to float said input/output lines, but not to pre-charge said input/output lines.

37. A method for refreshing data stored in a memory device, the method comprising:

operating a complementary input/output line pair driver circuit to enable said driver circuit to pre-charge said input/output line pair to pre-charge voltage;

operating said input/output line pair to transmit or receive array data to or from a bitline pair wherein said bitline pair transmits or receives said array data to or from a sense amplifier; and operating said driver circuit during an auto-refresh mode to prevent said driver circuit from pre-charging said input/output line pair to said pre-charge voltage.

38. A method for refreshing data stored in a memory device, the method comprising:

operating a complementary input/output line pair driver circuit in a first mode of operation to enable said driver circuit to pre-charge said input/output lines to a first voltage;

operating said input/output line pair to transmit or receive array data to or from a bitline pair wherein said bitline pair transmits or receives said array data to or from a sense amplifier wherein said sense amplifier transmits or receives data to or from a memory cell; and operating said driver circuit during an auto refresh mode to prevent said driver circuit from pre-charging said input/output line pair to said first voltage.

* * * * *